(12) United States Patent
Yin et al.

(10) Patent No.: US 11,489,013 B2
(45) Date of Patent: Nov. 1, 2022

(54) DRIVE SENSING STRUCTURE AND BIDIRECTIONAL ORGANIC LIGHT-EMITTING DISPLAY DEVICE USING THE SAME

(71) Applicant: Guangzhou Tyrafos Semiconductor Technologies Co., Ltd., Guangzhou (CN)

(72) Inventors: Ping-Hung Yin, Taipei (TW); Jia-Shyang Wang, Miaoli County (TW)

(73) Assignee: Guangzhou Tyrafos Semiconductor Tech. Co., Ltd., Guangzhou (CN)

( * ) Notice: Subject to any disclaimer, the term of this patent is extended or adjusted under 35 U.S.C. 154(b) by 0 days.

(21) Appl. No.: 17/468,832

(22) Filed: Sep. 8, 2021

(65) Prior Publication Data

US 2022/0114960 A1 Apr. 14, 2022

Related U.S. Application Data

(60) Provisional application No. 63/089,055, filed on Oct. 8, 2020.

(51) Int. Cl.
*H01L 27/28* (2006.01)
*H04N 5/378* (2011.01)
*G06V 10/147* (2022.01)
*G06V 40/13* (2022.01)
(Continued)

(52) U.S. Cl.
CPC .......... *H01L 27/288* (2013.01); *G06V 10/147* (2022.01); *G06V 40/1318* (2022.01); *G09G 3/3233* (2013.01); *H04N 5/378* (2013.01); *G09G 2300/0842* (2013.01);
(Continued)

(58) Field of Classification Search
CPC .... G09G 3/32–3291; G09G 2300/0809–0876; G06V 40/12–1394
See application file for complete search history.

(56) References Cited

U.S. PATENT DOCUMENTS

| | | | |
|---|---|---|---|
| 8,466,902 B2* | 6/2013 | Boer | G06F 3/0412 345/173 |
| 11,232,276 B2* | 1/2022 | Wang | G09G 3/3233 |
| 11,250,781 B2* | 2/2022 | Qin | G09G 3/3258 |

(Continued)

*Primary Examiner* — Patrick F Marinelli
(74) *Attorney, Agent, or Firm* — Lin & Associates Intellectual Property, Inc.

(57) ABSTRACT

The invention relates to a drive sensing structure, applicable to an environment of an organic light-emitting display device. The driving sensing structure includes: an organic diode, a driving circuit, a sensing circuit, and a voltage maintaining circuit; wherein, the driving circuit is used to receive a control signal and generate a corresponding voltage signal to drive the organic diode to emit light stably. The sensing circuit is used to convert a sensing voltage generated by the organic diode after receiving the light source into an image electrical signal. The voltage maintaining circuit is used to adjust the voltage signal of the driving circuit to prevent the voltage signal of the driving circuit from drifting. Thereby, the bidirectional organic light-emitting display device can be used not only as a light-emitting element, but also as a sensor for fingerprint image recognition, palmprint recognition, and touch function, thereby achieving the purposes of cost reduction and wide applicability.

8 Claims, 7 Drawing Sheets

(51) Int. Cl.
*G09G 3/3233* (2016.01)
*H01L 27/32* (2006.01)

(52) U.S. Cl.
CPC ..... *G09G 2310/08* (2013.01); *G09G 2360/14* (2013.01); *H01L 27/3211* (2013.01)

(56) References Cited

U.S. PATENT DOCUMENTS

| | | | |
|---|---|---|---|
| 2018/0165533 A1* | 6/2018 | Cho | G06V 40/10 |
| 2019/0004650 A1* | 1/2019 | Ma | G06F 3/0416 |
| 2019/0279566 A1* | 9/2019 | Wang | G09G 3/3241 |
| 2021/0027711 A1* | 1/2021 | Qin | G09G 3/3258 |
| 2021/0326554 A1* | 10/2021 | Wang | G06F 3/0412 |
| 2022/0114960 A1* | 4/2022 | Yin | H04N 5/378 |

* cited by examiner

DRIVE SENSING STRUCTURE AND BIDIRECTIONAL ORGANIC LIGHT-EMITTING DISPLAY DEVICE USING THE SAME

CROSS-REFERENCE TO RELATED APPLICATION

This application claims the priority of U.S. provisional patent application No. 63/089,055, filed on Oct. 8, 2020, which is incorporated herewith by reference.

BACKGROUND OF THE INVENTION

1. Field of the Invention

The present invention relates generally to a drive sensing structure, in particular, relates to a drive sensing structure applied to fingerprint image recognition and a bidirectional organic light-emitting display device using the same.

2. The Prior Arts

With the development of mobile phone technology and the continuous growing demands from mobile phone users, the display screen of the smart phone has been developed towards a full-screen design for a better user experience, wherein, to provide unlock recognition, under-screen optical fingerprint recognition is currently a common solution on the market, which is not only used in smart phones, but also building fingerprint recognition systems, corporate attendance fingerprint recognition systems, and so on.

There are currently three development directions for under-screen fingerprint recognition using Organic Light-Emitting Diode (OLED) screens: (1) arranging at least one thin complementary metal oxide semiconductor (CMOS) sensor directly below the screen to be flatly attached to the bottom of the screen, and the gap between the sub-pixels of the OLED allowing light to pass through, thereby identifying fingerprints. The above technical features are similar to one-piece on glass solution (OGS) or one-piece touch on lens (TOL) of a capacitive touch panel, which can also become a miniature sensor chip and used an imaging lens set to make a lens-based sensor module to be assembled under the display screen; (2) using a thin-film transistor process, and using the sensitivity to visible light of amorphous silicon (a-Si:H) and polysilicon (poly-Si) to produce light sensitive elements on a glass substrate or a flexible substrate (such as polyimide film), and mounted under the OLED screen, which can also be used as a sealing glass to seal with the OLED panel to sense fingerprint information. The above technical features are similar to capacitive touch panels, also known as on-cells by those with ordinary knowledge in the art; (3) inserting image sensors between the pixels of OLEDs, an organic photodiode (OPD) being disposed on the thin-film transistor (TFT) substrate, in addition to each set of pixels (R/G/B), as a sensing element. The above technical features are similar to capacitive touch panels, also known as in-cell by those with ordinary knowledge in the art.

However, the problem of using the aforementioned solution (1) is that as users pursue the image quality of display devices, and the design and process technology of OLED display devices mature, the unit pixels on OLED panels are increasing, making the gap between the sub-pixels of the OLED gradually decreasing, and more difficult for the under-screen fingerprint recognition technology to allow the light penetrate through the gaps between the sub-pixels of the OLED, which makes the implementation of the aforementioned solution (1) less feasible. In addition, the problem of using the aforementioned solution (2) is the same as those of the aforementioned solution (1), which makes the implementation of the aforementioned solution (2) more difficult. The problem of using the aforementioned solution (3) is that the technical solution of shrinking the image sensor and inserting it between the pixels of the OLED causes the number of the unit pixels on the OLED panel to decrease, thereby reducing the resolution of the OLED panel.

Therefore, to address the above-mentioned deficiencies, the inventors disclosed the present invention.

SUMMARY OF THE INVENTION

A primary objective of the present invention is to provide a drive sensing structure, which has a driving circuit and a sensing circuit, and both are coupled to an anode of an organic diode; the driving circuit is used for receiving a control signal and generating a corresponding voltage signal to drive the organic diode to emit light stably, the sensing circuit converts a sensing voltage generated by the organic diode after receiving the light source into an image electrical signal. Thereby, the organic diode can be used as a display and an image sensor at the same time, so as to achieve the purposes of cost reduction and wide applicability.

Another objective of the present invention is to provide a bidirectional organic light-emitting display device, which has a plurality of unit pixels. The unit pixels emit light alternately, and when a part of the unit pixels emit light, the unit pixels are defined as in a light-emitting state, and the other part of the unit pixels not emitting light are defined as in a sensing state. As such, by using the unit pixels in the light-emitting state as the light-emitter for under-screen fingerprint recognition, and the unit pixels in the sensing state as the sensor for under-screen fingerprint recognition, the present invention provides a high-performance image recognition without affecting the panel pixels.

To achieve the foregoing objectives, the present invention provides a drive sensing structure, applicable to an environment of an organic light-emitting display device, the drive sensing structure comprises: an organic diode; a driving circuit, coupled to an anode of the organic diode, the driving circuit being used to receive a control signal and generate a corresponding voltage signal to drive the organic diode to emit light stably; a sensing circuit, coupled to the anode of the organic diode, the sensing circuit converting a sensing voltage generated by the organic diode after receiving the light source into an image electrical signal; and a voltage maintaining circuit, coupled to the driving circuit, the voltage maintaining circuit being used to adjust the voltage signal of the driving circuit to prevent the voltage signal of the driving circuit from drifting; wherein, the driving sensing structure having a light-emitting state and a sensing state, when the drive sensing structure being in the light-emitting state, the driving circuit driving the organic diode to emit light stably, and when the drive sensing structure is in the sensing state, the sensing circuit controlling the organic diode to convert the received light into the image electrical signal.

Preferably, according to the drive sensing structure of the present invention, the driving circuit comprises a first thin-film transistor and a second thin-film transistor, and the first thin-film transistor and the organic diode are connected in series, and the first thin-film transistor is used to convert the voltage signal into a current to drive the organic diode, the second thin-film transistor is coupled to the gate of the first thin-film transistor, and the second thin-film transistor is used to control the control signal inputted to the gate of the first thin-film transistor. However, the present invention is not limited hereto.

Preferably, according to the drive sensing structure of the present invention, the voltage maintaining circuit comprises a capacitor, the capacitor is coupled to the gate of the first thin-film transistor, and a data signal is stored in the capacitor; after the control signal ends, the capacitor can still drive the gate of the first thin-film transistor to prevent the voltage signal of the driving circuit from drifting. However, the invention is not limited hereto.

Preferably, according to the drive sensing structure of the present invention, the driving circuit comprises a plurality of thin-film transistors. However, the present invention is not limited hereto.

Preferably, according to the drive sensing structure of the present invention, when the drive sensing structure is in the sensing state, the organic diode is in a forward bias mode.

Preferably, according to the drive sensing structure of the present invention, the sensing circuit is a source follower.

Preferably, according to the drive sensing structure of the present invention, the drive sensing structure further comprises a reset circuit coupled to the driving circuit and the anode of the organic diode, and the reset circuit is used to reset the voltage value of the anode of the organic diode. However, the present invention is not limited hereto.

Moreover, to achieve the foregoing object, the present invention, based on the aforementioned drive sensing structure, further provides a bidirectional organic light-emitting display device, which comprises: a substrate; a plurality of unit pixels, disposed on the substrate, the unit pixels having the aforementioned drive sensing structure so that when the unit pixels emitting light alternately, a part of the unit pixels emitting light being defined as in a light-emitting state, and the other part of the unit pixels not emitting light being defined as in a sensing state; and a readout circuit, coupled to each of the unit pixels, the readout circuit receiving the image electrical signal, and processing the image electrical signal to generate a corresponding image information; wherein, the unit pixels in the light-emitting state being used as a light-emitting area, the unit pixels in the sensing state being used as a sensing area, and a part of the unit pixels in the light-emitting area emitting an emitted light to a test object, then the emitted light being reflected by the test object to generate a reflected light, and a part of the unit pixels in the sensing area receiving the reflected light to generate the image electrical signal.

Preferably, according to the bidirectional organic light-emitting display device of the present invention, the readout circuit adopts one of a correlated double sampling (CDS) circuit and a digital double sampling (DDS) circuit. However, the present invention is not limited hereto.

Preferably, according to the bidirectional organic light-emitting display device of the present invention, the bidirectional organic light-emitting display device is one of an organic light-emitting diode display device and a micro light-emitting diode display device. However, the present invention is not limited hereto.

In summary, the drive sensing structure and the bidirectional organic light-emitting display device provided by the present invention are mainly using a driving circuit to drive an organic diode to emit light stably, using a sensing circuit to convert the sensing voltage generated after the organic diode receiving a light source into an image electrical signal, to make the unit pixels emit light alternately; wherein, when a part of the unit pixels emit light, the unit pixels are defined as in a light-emitting state, and the other part of the unit pixels not emitting light are defined as in a sensing state. As such, by using the unit pixels in the light-emitting state as the light-emitter for under-screen fingerprint recognition, and the unit pixels in the sensing state as the sensor for under-screen fingerprint recognition, the present invention provides a high-performance image recognition without affecting the panel pixels.

To enable those skilled in the art to understand the purpose, features, and effects of the present invention, the following specific embodiments and accompanying drawings are used to explain the present invention in detail as follows.

BRIEF DESCRIPTION OF THE DRAWINGS

The present invention will be apparent to those skilled in the art by reading the following detailed description of a preferred embodiment thereto, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
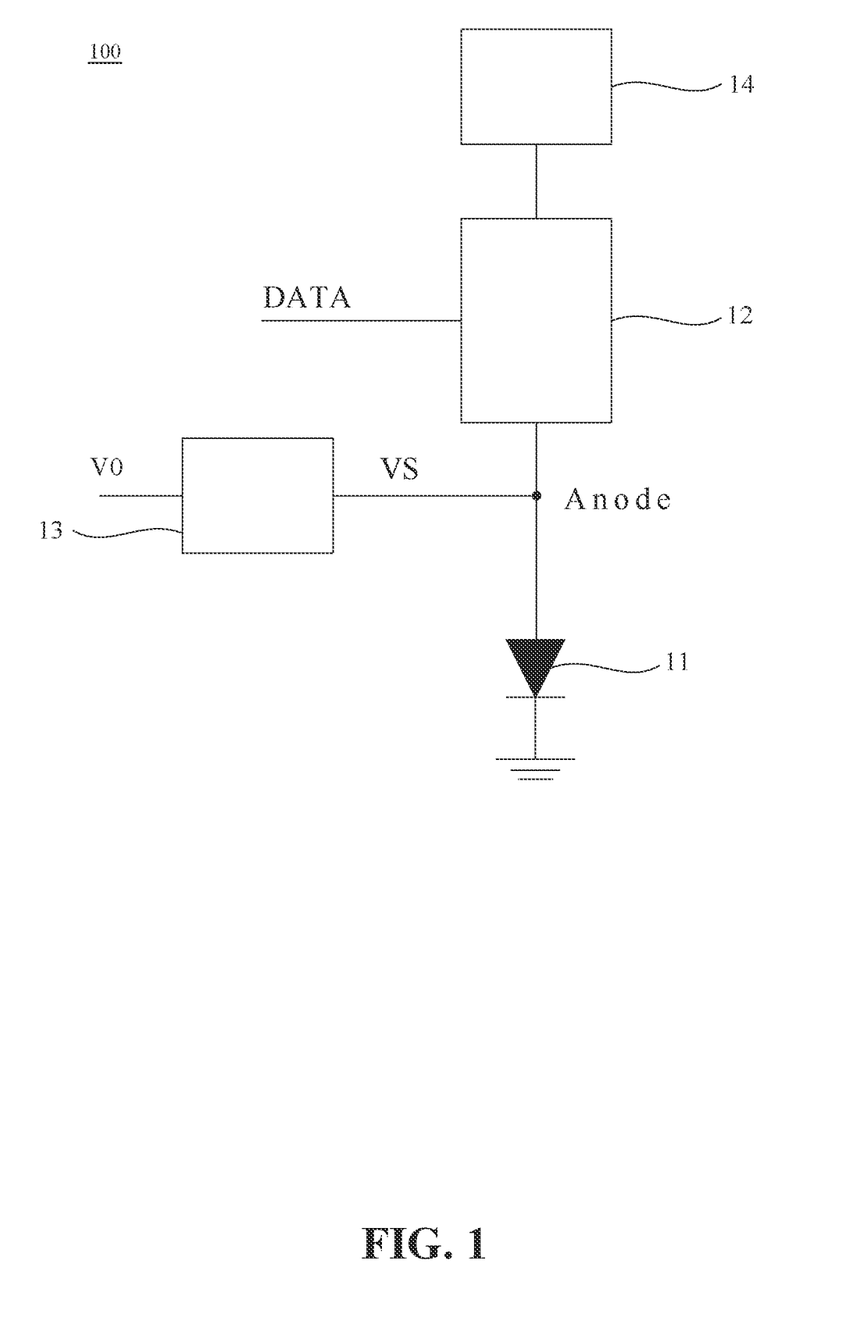
FIG. 1 is a schematic view of a drive sensing structure according to the present invention.

FIG. 1 is a schematic view of a drive sensing structure according to the present invention. As shown in FIG. 1, the driving sensing structure 100 according to the present invention includes: an organic diode 11, a driving circuit 12, a sensing circuit 13, and a voltage maintaining circuit 14.

Specifically, the drive sensing structure 100 is applied to the environment of an organic light-emitting display device. For example, the organic light-emitting display device may be, but not limited to, one of an organic light-emitting diode display device and a micro light-emitting diode.

Figure 2:
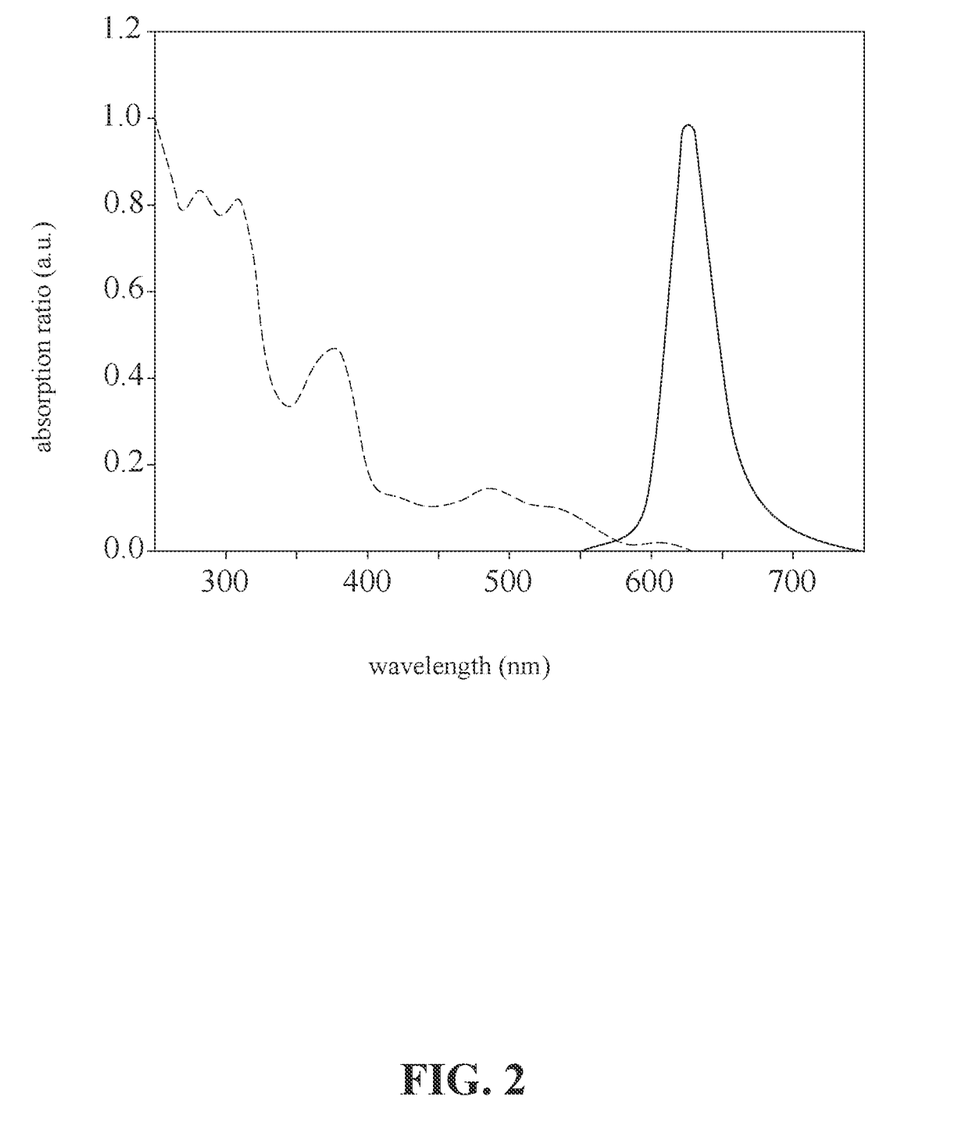
FIG. 2 illustrates the absorption spectrum and emission spectrum of an exemplary host material of the organic diode according to the present invention.

Also, refer to FIG. 2. FIG. 2 illustrates the absorption spectrum and the emission spectrum of an exemplary host material of the organic diode according to the present invention. In some embodiments, as shown in FIG. 2, the organic light-emitting diode 11 according to the present invention uses fluorescent or phosphorescent material as the host material of the light-emitting layer, and the main characteristic of the organic material is that when the molecules inside the material absorb radiant energy higher than its own energy, the electrons are excited from the ground state to an excited state with higher energy, and then the electrons in the excited state decays to the ground state to generate light. It can be understood that the organic diode 11 according to the present invention can also generate a corresponding image electrical signal by absorbing radiant energy higher than its own energy.

Specifically, as shown in FIG. 1, the driving circuit 12 according to the present invention is coupled to the anode Anode of the organic diode 11. The driving circuit is used to receive the control signal DATA and generate a corresponding voltage signal to drive the organic diode 11 to stably emit light. It should be further noted that, in some embodiments, the driving circuit 12 may have two thin-film transistors, and the driving circuit 12 includes a first thin-film transistor and a second thin-film transistor, wherein the first thin-film transistor and the organic diode 11 are serially connected, the second thin-film transistor is coupled to the gate of the first thin-film transistor, and the second thin-film transistor is used to control the control signal DATA inputted to the gate of the first thin-film transistor, so that the first thin-film transistor converts the voltage signal corresponding to the control signal DATA into a current to drive the organic diode 11.

Specifically, as shown in FIG. 1, the sensing circuit 13 according to the present invention is coupled to the anode Anode of the organic diode 11, and the sensing circuit 13 coverts a sensed voltage VS generated by the organic diode 11 after receiving a light source into an image electrical signal VO. It should be further noted that, in some embodiments, the sensing circuit 13 may have only one thin-film transistor, the gate voltage of the thin-film transistor is determined by the sensing voltage VS, and the thin-film transistor is used to convert the sensing voltage VS into the image electrical signal VO. However, the invention is not limited hereto.

It should be further noted that, in some embodiments, the drive sensing structure 100 according to the present invention has a light-emitting state and a sensing state. When the drive sensing structure 100 is in the light-emitting state, the driving circuit 12 is to drive the organic diode 11 to emit light stably. When the drive sensing structure 100 is in the sensing state, the sensing circuit 13 controls the organic diode 11 to convert the received light source into the image electrical signal. It is worth mentioning that, in some embodiments, when the drive sensing structure 100 is in the sensing state, the organic diode 11 is in the forward-biased mode. At this point, the voltage at the anode Anode of the organic diode 11 is greater than the voltage at the cathode of the organic diode 11. However, the present invention is not limited hereto.

It is worth mentioning that, in some embodiments, the sensing circuit 13 may be a source follower, that is, the gate of the thin-film transistor of the sensing circuit 13 is used as a signal input terminal, and the source of the thin-film transistor is used as the signal output terminal. As such, the sensing voltage VS generated by the organic diode 11 after receiving the light source can be transmitted to the sensing circuit 13 to be converted into an image electrical signal VO without amplifying the signal. However, the present invention is not limited hereto.

Specifically, as shown in FIG. 1, the voltage maintaining circuit 14 according to the present invention is coupled to the driving circuit 12, and the voltage maintaining circuit 14 is used to adjust the voltage signal of the driving circuit 12 to prevent the voltage signal of the driving circuit 12 from drifting. It should be further noted that, in some embodiments, the voltage maintaining circuit 14 only includes a capacitor, which is coupled to the gate of the aforementioned first thin-film transistor, and a data signal Vdata is stored in the capacitor. When the control signal DATA ends, the capacitor can still drive the gate of the first thin-film transistor to prevent the voltage signal of the driving circuit 12 from drifting.

It is worth mentioning that the drive sensing structure 100 according to the present invention may further include a reset circuit, which is coupled to the driving circuit and the anode Anode of the organic diode 11, and the reset circuit is used for resetting the voltage value of the anode Anode of the organic diode 11. Thereby, by resetting the voltage value of the anode Anode of the organic diode 11, the inability of the image electrical signal VO to obtain correct digital pixel value when performing analog-digital conversion is prevented, and the performance stability and accuracy of the drive sensing structure 100 according to the present invention is further improved.

As such, based on the drive sensing structure 100 according to the present invention, the driving circuit 12 receives the control signal DATA and generates a corresponding voltage signal to drive the organic diode 11 to emit light stably, and the sensing circuit 13 converts the sensing voltage VS generated by the organic diode 11 after receiving the light source into an image electrical signal VO. Thereby, the organic diode 11 can be used as a display and an image sensor at the same time, so as to achieve the purposes of cost reduction and wide applicability.

First Embodiment

Hereinafter, with reference to the drawings, the first embodiment of the drive sensing structure 100 of the present invention will be described.

Figure 3:
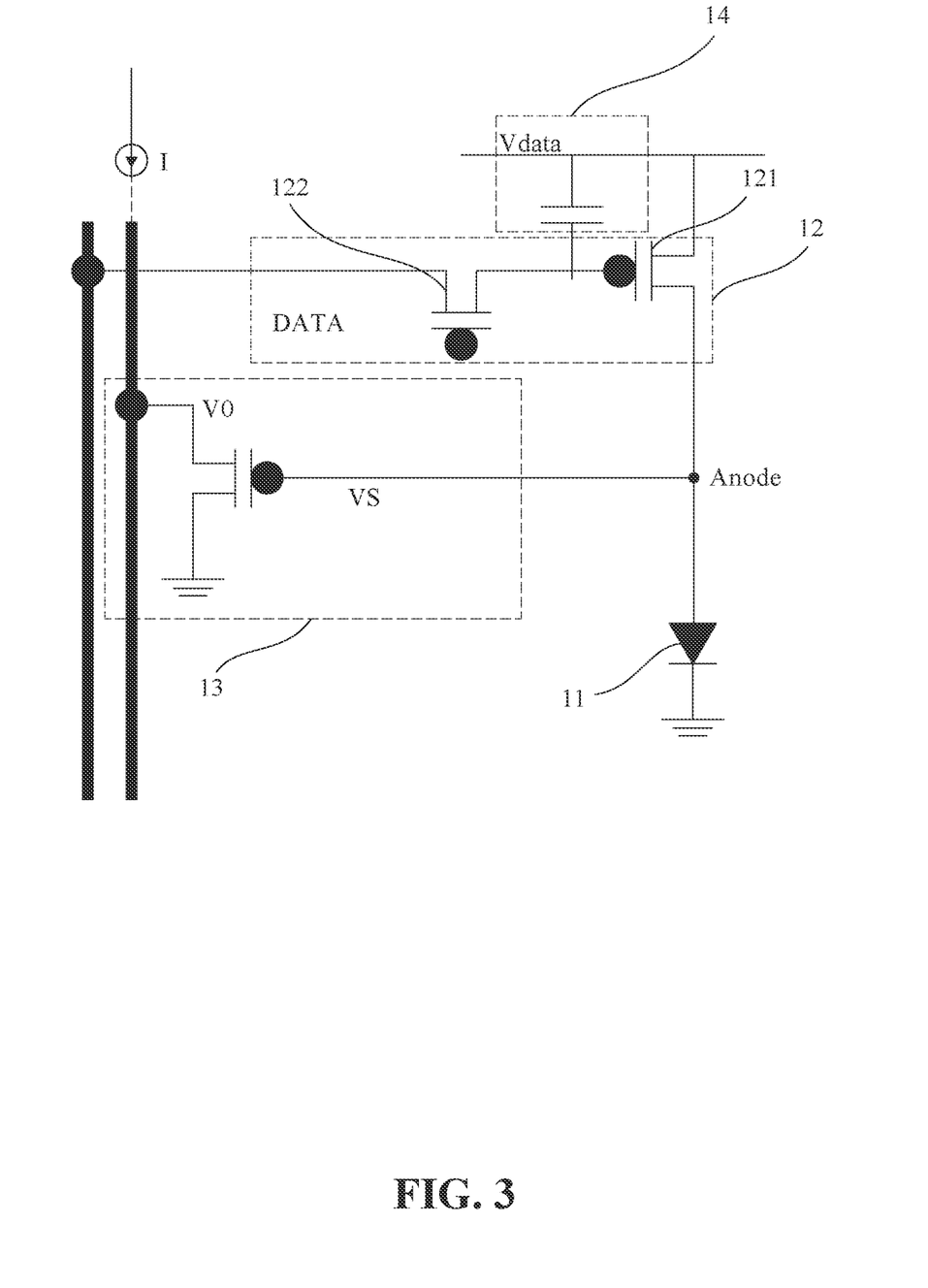
FIG. 3 is a schematic view illustrating the drive sensing structure according to the first embodiment of the present invention.

Refer to FIG. 3, which is a schematic diagram of a display device according to the first embodiment of the present invention. As shown in FIG. 3, the drive sensing structure 100 according to the first embodiment of the present invention is applied to the environment of an organic light-emitting display device. The drive sensing structure 100 includes: an organic diode 11, a driving circuit 12, a sensing circuit 13, and a voltage maintaining circuit 14.

Specifically, as shown in FIG. 3, the driving circuit 12 according to the present invention is coupled to the anode Anode of the organic diode 11. The driving circuit is used to receive the control signal DATA and generate a corresponding voltage signal to drive the organic diode 11 to stably emit light. As shown in FIG. 3, the driving circuit 12 of the first embodiment of the present invention may have two thin-film transistors, and the driving circuit 12 includes a first thin-film transistor 121 and a second thin-film transistor 122, wherein the first thin-film transistor 121 and the organic diode 11 are serially connected, the second thin-film transistor 122 is coupled to the gate of the first thin-film transistor 121, and the second thin-film transistor 122 is used to control the control signal DATA inputted to the gate of the first thin-film transistor 121, so that the first thin-film transistor 121 converts the voltage signal corresponding to the control signal DATA into a current to drive the organic diode 11.

Specifically, as shown in FIG. 3, the sensing circuit 13 according to the first embodiment of the present invention is coupled to the anode Anode of the organic diode 11, and the sensing circuit 13 coverts a sensed voltage VS generated by the organic diode 11 after receiving a light source into an image electrical signal VO. As shown in FIG. 3, the sensing circuit 13 of the first embodiment of the present invention may have only one thin-film transistor, the gate voltage of the thin-film transistor is determined by the sensing voltage VS, and the thin-film transistor is used to convert the sensing voltage VS into the image electrical signal VO. However, the invention is not limited hereto.

Specifically, as shown in FIG. 3, the voltage maintaining circuit 14 according to the first embodiment of the present invention is coupled to the driving circuit 12, and the voltage maintaining circuit 14 is used to adjust the voltage signal of the driving circuit 12 to prevent the voltage signal of the driving circuit 12 from drifting. As shown in FIG. 3, the voltage maintaining circuit 14 of the first embodiment of the present invention only includes a capacitor, which is coupled to the gate of the aforementioned first thin-film transistor 121, and a data signal Vdata is stored in the capacitor. When the control signal DATA ends, the capacitor can still drive the gate of the first thin-film transistor 121 to prevent the voltage signal of the driving circuit 12 from drifting. However, the invention is not limited hereto.

The following provides other examples of drive sensing structure 100, so that a person with ordinary knowledge in the technical field of the present invention can more clearly understand the possible changes. The elements indicated by the same element symbols as in the foregoing embodiment are substantially the same as those described above with reference to FIGS. 1 and 3. The elements, features, and advantages that are the same as those of the drive sensing structure 100 will not be described in detail.

Figure 4:
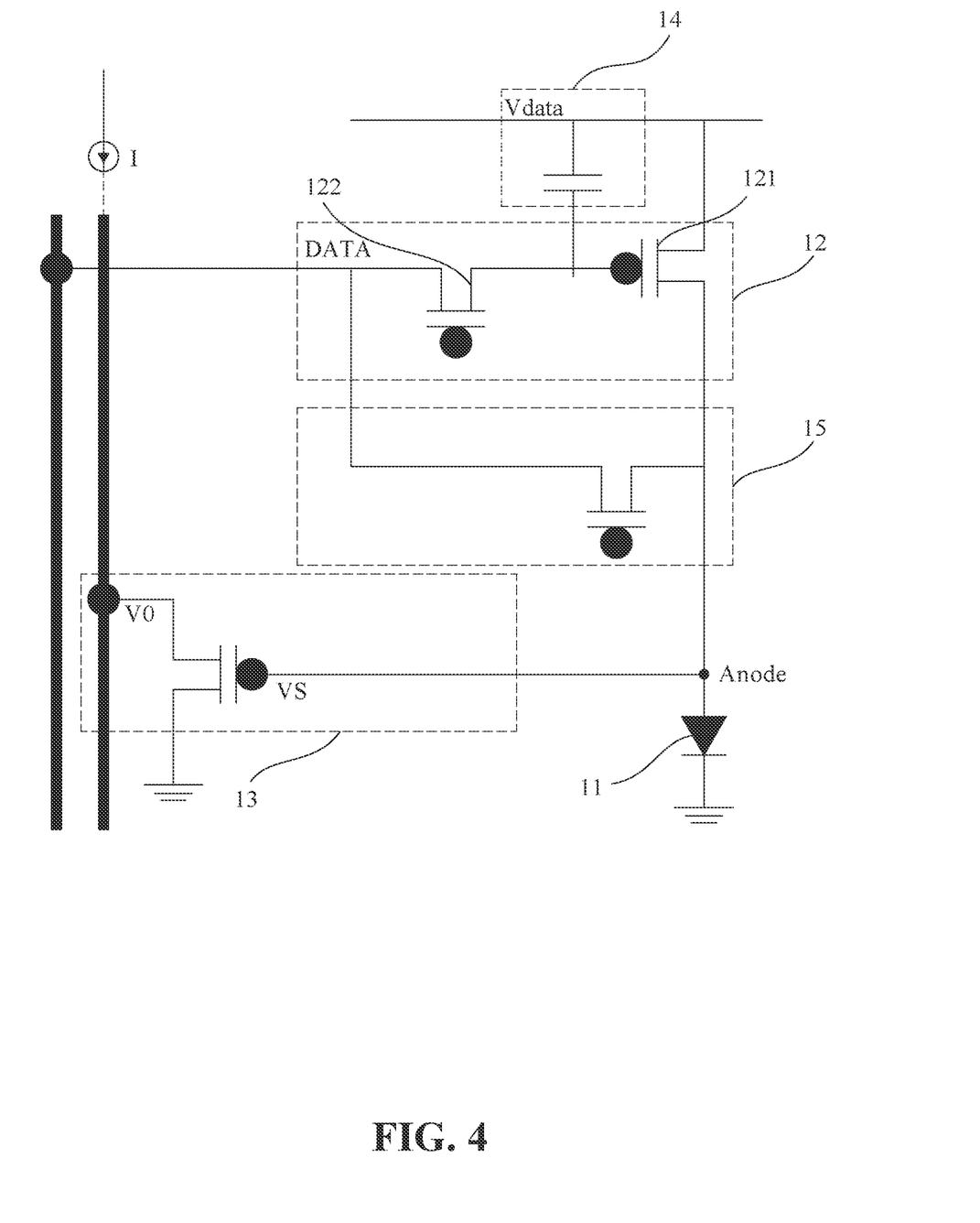
FIG. 4 is a schematic view illustrating the drive sensing structure according to the second embodiment of the present invention.

Refer to FIG. 4, which illustrates the drive sensing structure 100 according to the second embodiment of the present invention. Compared with the first embodiment, the main structural difference of the second embodiment is that, in the drive sensing structure 100 of the second embodiment, the driving circuit 12 includes a plurality of thin-film transistors. For example, the driving circuit 12 may include 2 thin-film transistors, 3 thin-film transistors, 4 thin-film transistors, 5 thin-film transistors, 6 thin-film transistors, and 7 thin-film transistors. As shown in FIG. 4, two thin-film transistors are provided to further improve the stability and accuracy of the drive sensing structure 100 according to the present invention. However, the present invention is not limited hereto.

As shown in FIG. 4, the drive sensing structure 100 according to the second embodiment of the present invention may further include a reset circuit 15, which is coupled to the driving circuit 12 and the anode Anode of the organic diode 11. The reset circuit 15 is used to reset the voltage value of the anode Anode of the organic diode 11. As such, by resetting the voltage value of the anode Anode of the organic diode 11, the inability of the image electrical signal VO to obtain correct digital pixel value when performing analog-digital conversion is prevented, and the performance stability and accuracy of the drive sensing structure 100 according to the present invention is further improved. Moreover, the materials and other characteristics used in the drive sensing structure 100 according to the second embodiment of the present invention are similar to those of the drive sensing structure 100 according to the first embodiment of the present invention, and will not be repeated here.

It can be understood that a person with ordinary knowledge in the technical field of the present invention can make various changes and adjustments based on the above examples, which will not be listed here.

Figure 5:
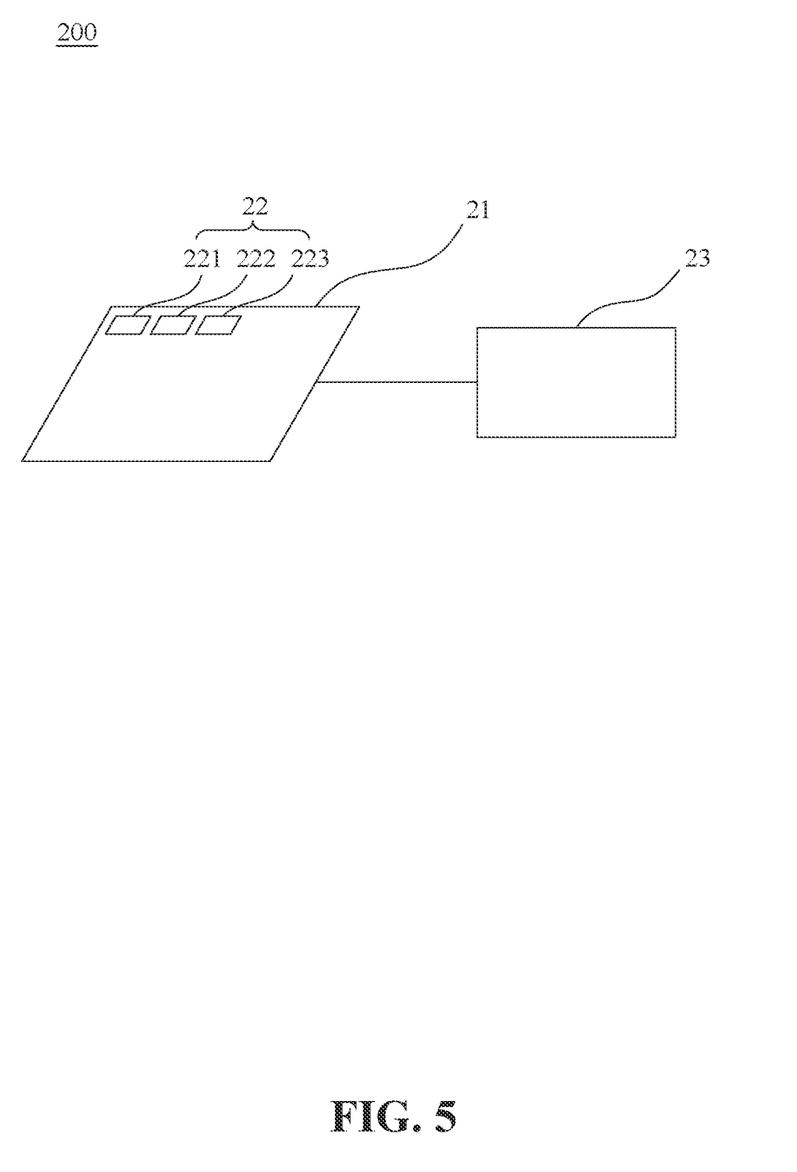
FIG. 5 is a schematic view illustrating a bidirectional organic light-emitting display device according to the present invention.
Figure 6:
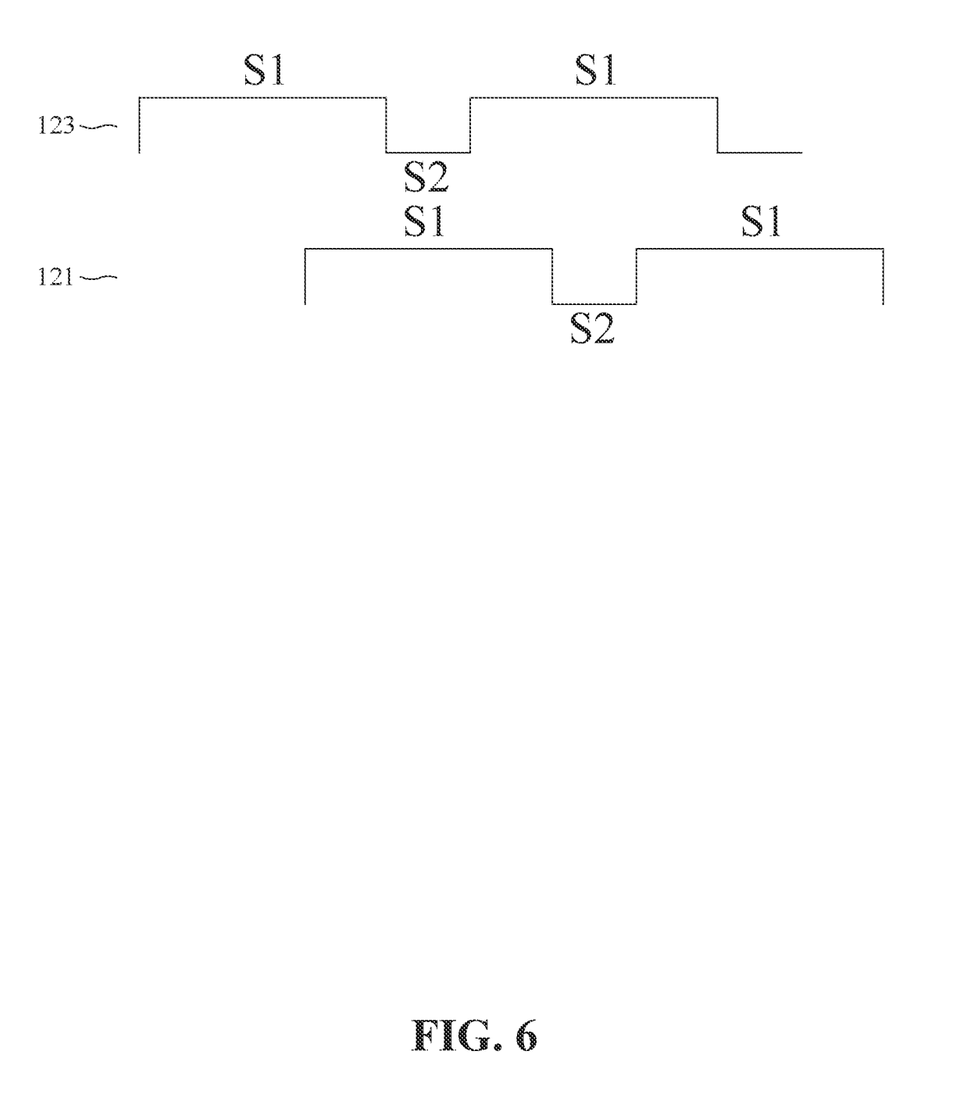
FIG. 6 is a timing diagram illustrating a display device implementing the present invention.

Refer to FIG. 5 and FIG. 6. FIG. 5 is a schematic view illustrating a bidirectional organic light-emitting display device according to the present invention; FIG. 6 is a timing diagram illustrating the implementing of a display device of the present invention. The bidirectional organic light-emitting display device 200 according to the present invention includes: a substrate 21, a plurality of unit pixels 22, and a readout circuit 23; wherein the unit pixels 22 all have the aforementioned drive sensing structure 100, so that when the unit pixels emit light alternately, as shown in FIG. 6, the unit pixels emitting light are in the light-emitting state S1, and the unit pixels not emitting light are in the sensing state S2.

Specifically, the unit pixels 22 are disposed on the substrate 21, and the unit pixels 22 include red unit pixels 221, green unit pixels 222, and blue unit pixels 223, wherein the red unit pixels 221 emit red incident light R, the green unit pixels 222 emit green light incident light G, and the blue unit pixels 223 emit blue incident light B.

Figure 7:
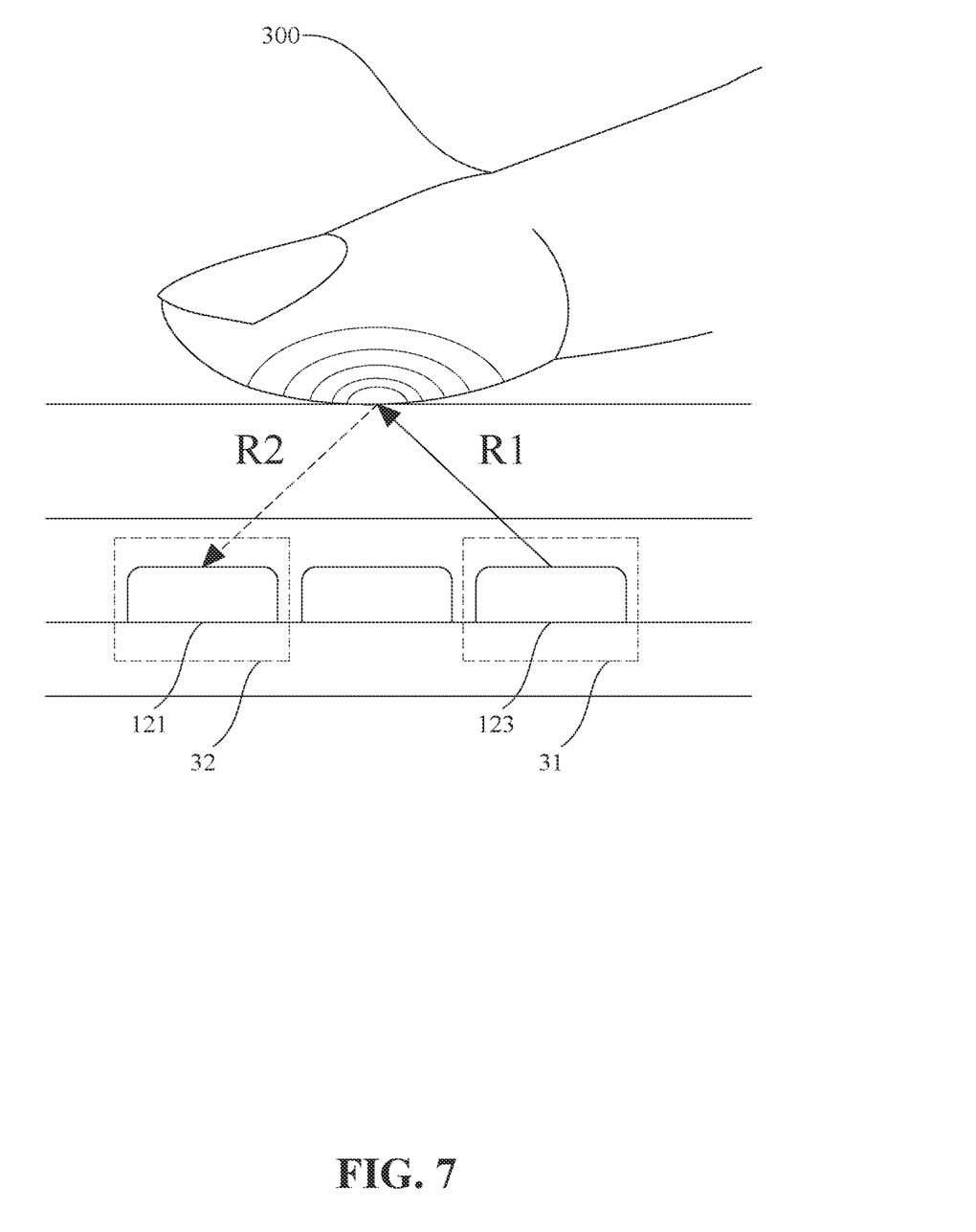
FIG. 7 is a schematic view illustrating that the light from the light-emitting area according to the present invention is reflected to the sensing area after irradiating the test object.

Refer to FIG. 6 in conjunction with FIG. 5 and FIG. 7. FIG. 7 is a schematic view illustrating that the light from the light-emitting area according to the present invention is reflected to the sensing area after irradiating the test object. In some embodiments, the blue unit pixel 223 in the light-emitting state is used as the light-emitting area 31, and the red unit pixel 221 in the sensing state is used as the sensing area 32. First, the unit pixels 22 on the bidirectional organic light-emitting display device 200 emit light alternately, wherein the part of the unit pixels 22 emitting light is defined as in a light-emitting state S1; another part of the unit pixels 22 not emitting light is defined as in the sensing state S2. Next, the blue unit pixels 223 in the light-emitting state S1 are used as the light-emitting area 31, and then, the red unit pixels 221 in the sensing state S2 are used as the sensing area 32. Then, a part of the blue unit pixels 223 in the light-emitting area 31 is driven to emit an incident light $R_1$ to the test object 300, and the incident light R1 is reflected by the test object 300 to generate a reflected light R2. Next, a part of the red unit pixels 221 in the sensing area 32 is driven to sense the reflected light R2, and the sensing area 32 generates a corresponding image electrical signal VO. Finally, the readout circuit 23 receives the image electrical signal VO to generate corresponding image information.

It should be further explained that, in an embodiment of the present invention, the readout circuit 23 can be implemented by using an existing readout circuit architecture. For example, the readout circuit 23 can be implemented by a readout circuit having a correlated double sampling (CDS) circuit and a digital double sampling (DDS) circuit. However, the present invention is not limited to hereto. The invention does not limit the circuit structure of the readout circuit 23. Since the implementation and operation of the readout circuit are familiar to those with ordinary knowledge in the art, they will not be repeated here.

It is worth mentioning that the bidirectional organic light-emitting display device 200 according to the present invention can be one of an organic light-emitting diode display device and a micro light-emitting diode display device. However, the present invention is not limited hereto.

Thus, based on the drive sensing structure 100 of the present invention, the driving circuit 12 receives the control signal DATA and generates a corresponding voltage signal to drive the organic diode to emit light stably, and the sensing circuit 13 converts the sensing voltage VS generated by the organic diode 11 after receiving the light source into an image electrical signal VO, so that the bidirectional organic light-emitting display device 200 provided by the present invention can be used not only as a light-emitting element, but also as a sensing element of fingerprint image recognition, palmprint recognition, and touch functions. In the present invention, the term "touch function" is a common term in related fields, which can also achieve functions such as pointer movement and button pressing.

Finally, the technical features of the present invention and its achievable technical effects are summarized as follows:

First, based on the drive sensing structure 100 of the present invention, the driving circuit 12 receives the control signal DATA and generates a corresponding voltage signal to drive the organic diode 11 to emit light stably, and the sensing circuit 13 converts the sensing voltage VS generated by the organic diode 11 after receiving the light source into an image electrical signal VO. Thereby, the organic diode 11 can be used as a display and an image sensor at the same time, so as to achieve the purposes of cost reduction and wide applicability.

Second, the reset circuit 15 of the present invention is coupled to the driving circuit 12 and the anode Anode of the organic diode 11. The reset circuit is used to reset the voltage value of the anode Anode of the organic diode 11. As such, by resetting the voltage value of the anode Anode of the organic diode 11, the inability of the image electrical signal VO to obtain correct digital pixel value when performing analog-digital conversion is prevented, and the performance stability and accuracy of the drive sensing structure 100 according to the present invention is further improved.

Third, based on the drive sensing structure 100 of the present invention, the bidirectional organic light-emitting display device 200 provided by the present invention is used to successfully provide a high-performance image recognition without affecting the pixels of the panel. At the same time, the present invention is used as a sensing element for fingerprint image recognition, palmprint recognition, and touch function.

Fourth, with the drive sensing structure 100 and the bidirectional organic light-emitting display device 200 of the present invention, the issue of the decreasing gap between the sub-pixels of the OLED is successfully resolved, and the difficulty for under-screen fingerprint recognition technology to use the gap between the sub-pixels of the OLED allows light to pass is overcome, and the under screen fingerprint recognition technology can still be implemented on the high-pixel OLED panel.

Although the present invention has been described with reference to the preferred embodiments thereto, it is apparent to those skilled in the art that a variety of modifications and changes may be made without departing from the scope of the present invention which is intended to be defined by the appended claims.

What is claimed is:

1. A drive sensing structure, applicable to an environment of an organic light- emitting display device, comprising:
    an organic diode;
    a driving circuit, coupled to an anode of the organic diode, the driving circuit being used to receive a control signal and generate a corresponding voltage signal to drive the organic diode to emit light stably;
    a sensing circuit, coupled to the anode of the organic diode, the sensing circuit converting a sensing voltage, generated by the organic diode after receiving a light, into an image electrical signal; and
    a voltage maintaining circuit, coupled to the driving circuit, the voltage maintaining circuit being used to adjust the voltage signal of the driving circuit to prevent the voltage signal of the driving circuit from drifting;
    wherein, the driving sensing structure has a light-emitting state and a sensing state, when the drive sensing structure is in the light-emitting state, the driving circuit drives the organic diode to emit light stably, and when the drive sensing structure is in the sensing state, the sensing circuit controls the organic diode to convert the received light into the image electrical signal,
    wherein the driving circuit comprises a first thin-film transistor and a second thin-film transistor, the first thin-film transistor and the organic diode are directly connected in series, the first thin-film transistor is used to convert the voltage signal into a current to drive the organic diode, the second thin-film transistor is directly coupled to a gate of the first thin-film transistor, and the second thin-film transistor is used to control the control signal inputted to the gate of the first thin-film transistor,
    wherein the sensing circuit is a source follower comprising of a third thin-film transistor, the gate of the third thin-film transistor is directly connected to the anode of the organic diode, a first electrode of the third thin-film transistor is directly connected a readout circuit, and a second electrode of the third thin-film transistor is directly connected to ground.

2. The drive sensing structure according to claim 1, wherein the voltage maintaining circuit comprises a capacitor, the capacitor is coupled to the gate of the first thin-film transistor, and a data signal is stored in the capacitor; after the control signal ends, the capacitor can still drive the gate of the first thin-film transistor to prevent the voltage signal of the driving circuit from drifting.

3. The drive sensing structure according to claim 1, wherein when the drive sensing structure is in the sensing state, the organic diode is in a forward bias mode.

4. The drive sensing structure according to claim 1, wherein the drive sensing structure further comprises a reset circuit coupled to the driving circuit and the anode of the organic diode, and the reset circuit is used to reset the voltage value of the anode of the organic diode.

5. A bidirectional organic light-emitting display device, comprising:
    a substrate;
    a plurality of unit pixels, disposed on the substrate, the unit pixels having the aforementioned drive sensing structure according to claim 1, so that when the unit pixels emit light alternately, a part of the unit pixels emitting light are defined as in a light-emitting state, and the other part of the unit pixels not emitting light are defined as in a sensing state; and
    the readout circuit, coupled to each of the unit pixels, the readout circuit receiving an image electrical signal, and processing the image electrical signal to generate a corresponding image information;
    wherein, the unit pixels in the light-emitting state are used as a light-emitting area, the unit pixels in the sensing state are used as a sensing area, and a part of the unit pixels in the light-emitting area emit an emitted light to a test object, then the emitted light is reflected by the test object to generate a reflected light, and a part of the unit pixels in the sensing area receive the reflected light to generate the image electrical signal.

6. The bidirectional organic light-emitting display device according to claim 5, wherein the readout circuit is one of a correlated double sampling (CDS) circuit and a digital double sampling (DDS) circuit.

7. The bidirectional organic light-emitting display device according to claim 5, wherein the bidirectional organic light-emitting display device is one of an organic light-emitting diode display device and a micro light-emitting diode display device.

8. An organic light emitting display device, comprising:
   a substrate
   a plurality of unit pixels disposed on the substrate,
   each of the unit pixels comprising:
      a first transistor;
      a second transistor;
      a third transistor;
      a capacitor; and
      an organic diode,
   wherein a first electrode of the second transistor is directly connected to a data line,
   wherein a second electrode of the second transistor is directly connected to a first electrode of the capacitor and the gate of the first transistor,
   wherein a second electrode of the first transistor is directly connected to the organic diode and a gate of the third transistor,
   wherein a first electrode of the third transistor is directly connected to a readout circuit,
   wherein a second electrode of the third transistor is directly connected to ground.

* * * * *